(12) United States Patent
Simmons

(10) Patent No.: US 6,469,909 B2
(45) Date of Patent: Oct. 22, 2002

(54) MEMS PACKAGE WITH FLEXIBLE CIRCUIT INTERCONNECT

(75) Inventor: Richard L. Simmons, Leander, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/756,928

(22) Filed: Jan. 9, 2001

(65) Prior Publication Data

US 2002/0089835 A1 Jul. 11, 2002

(51) Int. Cl.$^7$ ................................................ H05K 1/14
(52) U.S. Cl. ...................... 361/803; 361/749; 361/768; 257/48; 257/690; 257/686; 439/67; 439/71; 439/81
(58) Field of Search .................. 361/803, 776, 361/769, 795, 719, 741, 768; 174/52.4, 52, 175, 177; 257/48, 704, 690, 686; 439/71, 81, 67, 331

(56) References Cited

U.S. PATENT DOCUMENTS

| | | | |
|---|---|---|---|
| 4,164,003 A | 8/1979 | Cutchaw | 361/403 |
| 4,314,225 A | 2/1982 | Tominaga et al. | 388/4 |
| 4,340,266 A | 7/1982 | Grovender | 439/71 |
| 4,437,718 A | 3/1984 | Selinko | 439/591 |
| 4,832,612 A | 5/1989 | Grabbe et al. | 439/71 |
| 5,018,005 A | 5/1991 | Lin et al. | 257/730 |
| 5,163,837 A | 11/1992 | Rowlette, Sr. | 439/91 |
| 5,413,489 A | 5/1995 | Switky | 439/71 |
| 5,479,110 A | 12/1995 | Crane et al. | 324/757 |
| 5,531,329 A | 7/1996 | Hayakawa et al. | 206/722 |
| 5,742,484 A | 4/1998 | Gillette et al. | 361/789 |
| 5,745,346 A | 4/1998 | Ogawa et al. | 361/769 |
| 5,864,470 A | 1/1999 | Shim et al. | 361/777 |
| 5,969,259 A | 10/1999 | Cook, Sr. et al. | 73/756 |
| 6,093,576 A | 7/2000 | Otani | 438/5 |
| 6,225,692 B1 | 5/2001 | Hinds | 257/698 |

FOREIGN PATENT DOCUMENTS

| | | | |
|---|---|---|---|
| DE | 199 29 025 A1 | 6/1999 | H01L/21/56 |
| WO | WO 98/29942 | 7/1998 | H03H/9/10 |

OTHER PUBLICATIONS

U.S. patent application Ser. No. 09/757,182, Simmons, filed Jan. 9, 2001.

U.S. patent application Ser. No. 09/757,173, Simmons et al., filed Jan. 9, 2001.

R. Wayne Johnson et al, "Adhesive Based Flip Chip Technology for Assembly on Polyimide Flex Substrates," 1997 International Conference on Multichip Modules, Denver, CO Apr. 2–4, 1997 (New York, NY, IEEE), pp. 81–86.

*Primary Examiner*—David Martin
*Assistant Examiner*—Hung Bui
(74) *Attorney, Agent, or Firm*—Darla P. Fonseca; Scott A. Bardell

(57) ABSTRACT

A method of fabricating a package for a microelectromechanical systems (MEMS) device. A flex circuit interconnect subassembly for the package is made by placing a flex circuit on a pad insert, attaching a carrier insert to the pad insert to deflect the lead portions of the flex circuit, and applying a cover insert to the pad insert, after the attachment of the carrier insert, to re-deflect the lead portions of the flex circuit toward the device bond sites. The flex circuit interconnect subassembly may be combined with an electronic device die/carrier subassembly to form a completed electronic device package. The flex circuit interconnect subassembly and the die/carrier subassembly are joined using mechanical interlocking layers. The invention is particularly suited for making such an electronic device die/carrier subassembly which has a MEMS die permanently affixed to a carrier. The carrier is advantageously utilized during the process of releasing a protective coating from the surface of the MEMS die which support the various MEMS components. The MEMS components on the MEMS die are hermetically sealed, such as by bonding a cover to the upper package body or the lower package body. The cover may have features such as ports which allow the MEMS components to interact with the external environment.

9 Claims, 13 Drawing Sheets

MEMS PACKAGE WITH FLEXIBLE CIRCUIT INTERCONNECT

CROSS-REFERENCES TO RELATED APPLICATIONS

This application is related to U.S. patent application Ser. No. 09/757,182, filed Jan. 9, 2001, entitled "HERMETIC PACKAGE FOR MEMS DEVICES WITH INTEGRATED CARRIER", and U.S. patent application Ser. No. 09/757,173, filed Jan. 9, 2001, entitled "HERMETIC MEMS PACKAGE WITH INTERLOCKING LAYERS", both of which are filed concurrently herewith and which are hereby incorporated.

BACKGROUND OF THE INVENTION

1. Field of the Invention

The present invention generally relates to the interconnection of electronic components, particularly micro-electromechanical systems (MEMS), and more specifically to methods of fabricating packages for MEMS devices to provide external electrical connections, e.g., to printed circuit board leads.

2. Description of Related Art

As modern electronic devices have become more complicated, it has also become more difficult to interconnect their various components. For example, the physical size of microprocessors and integrated circuits (ICs) continues to shrink, but the number of leads provided on such chips is increasing due to added functionalities. The smaller size of the chips creates a problem when trying to provide connections between the chip leads and external devices or leads, such as those on a printed circuit board (PCB).

A state-of-the-art IC chip might be as small as one or two square centimeters, but have as many as 100 or more circuit leads. Typical interconnect spacing for the external leads is now on the order of 100–150 microns, and is expected to become even finer (e.g., 50 micron pitch). To reduce costs of assembly, semiautomatic or automatic insertion of components onto PCBs is often employed. Minor errors in the placement of these chips can accordingly result in misconnection, leading to nonfunctional units, and oftentimes damage to sensitive electrical circuits within the chips. These problems can be compounded on multi-chip modules (MCMs).

A variety of interconnection packages have been devised to assist in the placement of electronic devices. The package for a semiconductor device typically fulfills three functions. First, it provides environmental and physical protection for the silicon chip. Second, it provides a means to facilitate handling of the chip. Third, it provides electrical connections from the chip to the system in which it is installed. Packages are usually soldered to their circuit boards to physically and electrically connect the package to the circuit board. Other types of interconnection can be provided, such as optical or fluid ports.

An additional level of packaging in the form of a socket is sometimes used to electrically and physically connect the IC package to its printed circuit board. Sockets for IC packages are usually fitted with pins which are soldered to a circuit board. Pressure contacts can also be used, in which case the socket is pushed against the circuit board with screws, springs, or some other type of mounting hardware. In the latter configuration pressure contacts must have enough compliance or conformance to compensate for non-planarities present in the circuit board and/or the mounting surface of the IC package.

One exemplary IC package is disclosed in U.S. Pat. No. 5,413,489. In that design, an integrated circuit die is mounted onto the upper surface of a multi-layer ceramic carrier, or spreader. A conventional solder-bump flip-chip ("C4") process is used to connect the die to the substrate spreader. Interconnections can also be achieved using wire bonding, tape automated bonding (TAB), or elastomeric interconnects. The spreader is a multi-layered ceramic carrier, with vias forming connections between the layers. The bottom surface of the spreader has an array of contacts. A shell or cap is affixed to the spreader, surrounding and protecting the die. The spreader is placed in a molded plastic socket cover. The spreader and cover are further mounted on a socket base. The base has posts adapted to fit into corresponding holes of the circuit board.

Similar packaging and electrical interconnection considerations apply to micro-electromechanical systems (MEMS). In the field of miniaturization, it is not only electronic devices that have shrunk, but mechanical structures as well. MEMS devices are very small systems that are fabricated with technologies much like those used to fabricate integrated circuits, but MEMS devices interact with their environment in more ways than a traditional IC. MEMS devices typically have physical structures or mechanisms on an upper surface that perform the desired interaction with the environment, e.g., mechanical, optical or magnetic interactions.

MEMS devices may include very small electromechanical components such as switches, mirrors, capacitors, accelerometers, inductors, capacitive sensors and actuators that combine many of the most desirable aspects of conventional mechanical and solid-state devices. Unlike conventional mechanical devices, MEMS devices can be monolithically integrated with integrated circuitry, while providing much improved insertion loss and electrical isolation over solid-state devices. Typically, the MEMS devices are anchored to and suspended above the substrate so that they can move. For example switches open and close, variable capacitors are trimmed or tuned, actuators move back-and-forth and accelerometers deflect. Oftentimes these devices perform multiple functions or are simultaneously subjected to more than one signal. For example, low frequency signals are used to open and close MEMS switches and trim or tune variable capacitors while they conduct a high frequency AC signal. Mechanical actuators respond to an electrostatic force produced by a low frequency signal while functioning as an actuator. Accelerometers deflect in response to acceleration forces and in turn can modulate an AC signal. One example of a MEMS device is the micromachined fluid sensor disclosed in U.S. Pat. No. 5,969,259. In that design, side-ports are added to a dual in-line (DIP) type IC package, to provide fluid communication with sensors located inside the device.

The structures in MEMS devices are often quite robust when considered within the framework of their small size, but are very fragile relative to the macro-world of conventional IC packaging systems. Additional problems can arise relative to these devices, such as electrostatic and surface-tension induced attraction. Microscopic contamination can add to these problems and cause the device to fail when they induce detrimental electrostatic or surface-tension related attraction.

Surface micromachining, modified surface micromachining and frontside silicon-on-insulator (SOI) techniques are among those used to fabricate suspended MEMS devices. Surface micromachining uses standard deposition and patterning techniques to build-up the MEMS device on a substrate. Deposition and patterning techniques can also be used to build up the device on the surface of a substrate. MEMS devices are often fabricated such that the functional mechanism of the device remains buried within a sacrificial oxide material that is still present at the end of the "front-end" processing. At some suitable time prior to use or being completely packaged, the MEMS devices are released. The process of etching or otherwise removing the material that encases the components is often referred to as "releasing". It is a common practice to saw a semiconductor wafer into individual dies prior to their "release", so that particles from the sawing operation are less prone to foul the MEMS mechanisms. It is also common for the MEMS foundry to ship the die in the unreleased state. Shipping the MEMS die while still encased in its sacrificial oxide material (and having the foundry customer do the release of the device) helps reduce contamination of the device during shipping and handling.

While the use of a release layer is very desirable to protect the delicate MEMS components, this approach creates further problems during "back-end" processing by the final manufacturer/assembler. The MEMS device cannot be fully (i.e., hermetically) sealed prior to release, and so can still become contaminated or damaged during installation. It would, therefore, be desirable to devise an improved method for handling the MEMS die and performing the release operation. It would be further advantageous if the method could utilize packaging which provided a cost-effective and space-efficient means of connecting the MEMS die to external electrical/electronic signals, while maintaining a hermetic cavity for the MEMS mechanism.

SUMMARY OF THE INVENTION

It is therefore one object of the present invention to provide an improved method of interconnecting a micro-electromechanical system (MEMS) device to external circuitry.

It is another object of the present invention to provide such a method which facilitates the back-end release process of the MEMS die.

It is yet another object of the present invention to provide a hermetic package for MEMS devices.

The foregoing objects are achieved in a method of fabricating a flex circuit interconnect subassembly for use with a MEMS device, generally comprising the steps of placing a flex circuit on a pad insert, wherein the flex circuit has lead portions adapted to interconnect with bond pads formed on an electronic device die, attaching a carrier insert to the pad insert to deflect the lead portions of the flex circuit from a first plane toward a second plane, and applying a cover insert to the pad insert, after the attachment of the carrier insert, to re-deflect the lead portions of the flex circuit toward the first plane. The flex circuit interconnect subassembly may be combined with an electronic device die/carrier subassembly to form a completed electronic device package. The invention is particularly suited for making such an electronic device die/carrier subassembly which has a micro-electromechanical system (MEMS) die permanently affixed to a carrier. The carrier is advantageously utilized during the process of releasing a protective coating from the surface of the MEMS die which support the various MEMS components. In a preferred implementation the method uses a pin plate fixture, wherein the flex circuit is applied to the pin plate fixture, and then forced against the pad insert using the pin plate fixture. The carrier insert is attached to the pad insert while the flex circuit is applied to the pin plate fixture. The flex circuit interconnect subassembly is combined with the electronic device die/carrier subassembly after removing the pin plate fixture from the flex circuit and pad insert. The MEMS device package may have a cover providing various features for the MEMS devices, and may further have an overmolded body to provide a hermetic seal.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF AN ILLUSTRATIVE EMBODIMENT

Figure 1:
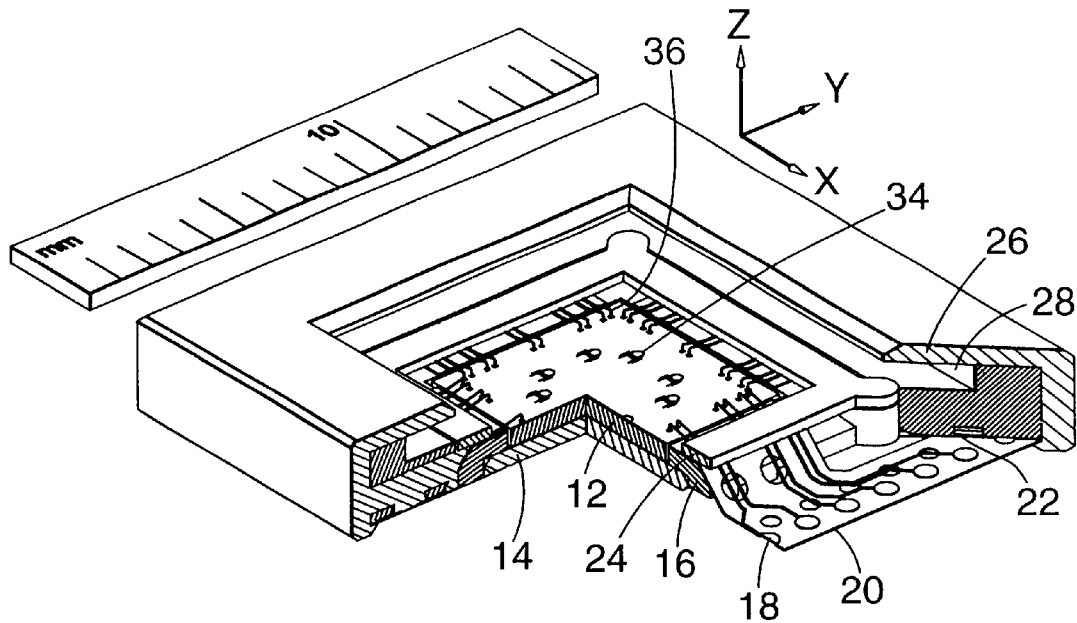
FIG. 1 is a perspective view with a partial section illustrating one embodiment of a micro-electromechanical system (MEMS) device package constructed in accordance with the present invention.

With reference now to the figures, and in particular with reference to FIG. 1, there is depicted one embodiment 10 of a packaged MEMS device constructed in accordance with the present invention. MEMS package 10 is generally comprised of a MEMS die 12, a carrier 14, a carrier insert 16, a ball grid array pad 18, a flex circuit substrate 20, a pad insert 22, a cover insert 24, and an outer body 26. MEMS package 10 also includes a cover which, although preferably transparent, is not shown in order to see the other elements of the package. The cover is retained in slot 28 formed between pad insert 22 and outer body 26.

Figure 2:
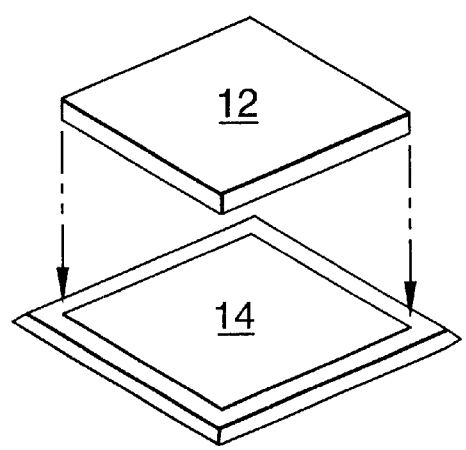
FIG. 2 is a perspective view illustrating the attachment of the MEMS die and carrier which are part of the MEMS package of FIG. 1.
Figure 3:
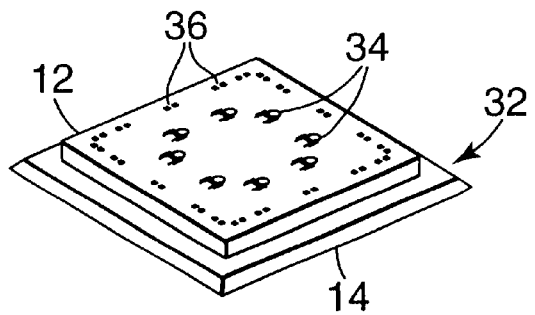
FIG. 3 is a perspective view of the die/carrier subassembly of FIG. 2 with the protective die coating removed.

The preferred method of fabricating package 10 is illustrated in FIGS. 2–12. The method begins with the pre-processing of MEMS die 12 as shown in FIGS. 2 and 3. A standard die-attach machine can be used to perform the placement of MEMS die 12 onto carrier 14, since the MEMS mechanisms are encased in their sacrificial oxide (i.e., unreleased). Standard die-attach processing may involve the use of a vacuum-based end-effector (vacuum pipette) to pick up the die and place it onto a lead-frame die paddle or into a package body. The vacuum pipette would most likely damage most MEMS devices if it were to directly contact them, but in this method they are still protected by the sacrificial oxide and they will not be harmed by a conventional die attach processing.

MEMS die 12 is attached to carrier 14 using conventional adhesive 30 (e.g., unfilled-epoxy) to form a MEMS subassembly 32. Carrier 14 is used during the early stages of completing package 10 to holding MEMS subassembly 32 without having to directly grip MEMS die 12, and is encased in the final package. MEMS carrier 14 is provided with beveled edges that serve two primary functions. First, the detail on the edge of the carrier facilitates handling during the early stages of processing by providing a mechanical detail that is easy to grip. Second, the detail on the edge allows for MEMS carrier 14 to be locked into place when the final package mold body is applied. As an alternative to beveling, a groove can be cut in the perimeter of the carrier.

MEMS subassembly 32 is next processed by releasing the sacrificial oxide layer on die 12. This step may be accomplished, for example, by gripping MEMS carrier 14 and immersing die 12 into a bath of industrial (hydrofluoric) acid (HF). A likely material for the MEMS carrier is monel, since it is very resistant to HF. FIG. 3 shows MEMS subassembly 32 after the MEMS mechanisms 34 and bond pads 36 have been released. In the illustrative embodiment, package 10 is a 40-lead device. Higher or lower lead count packages are easily configured with the system proposed in this invention, since the outer-lead interconnect is based on ball grid array (BGA) interconnection.

Figure 4:
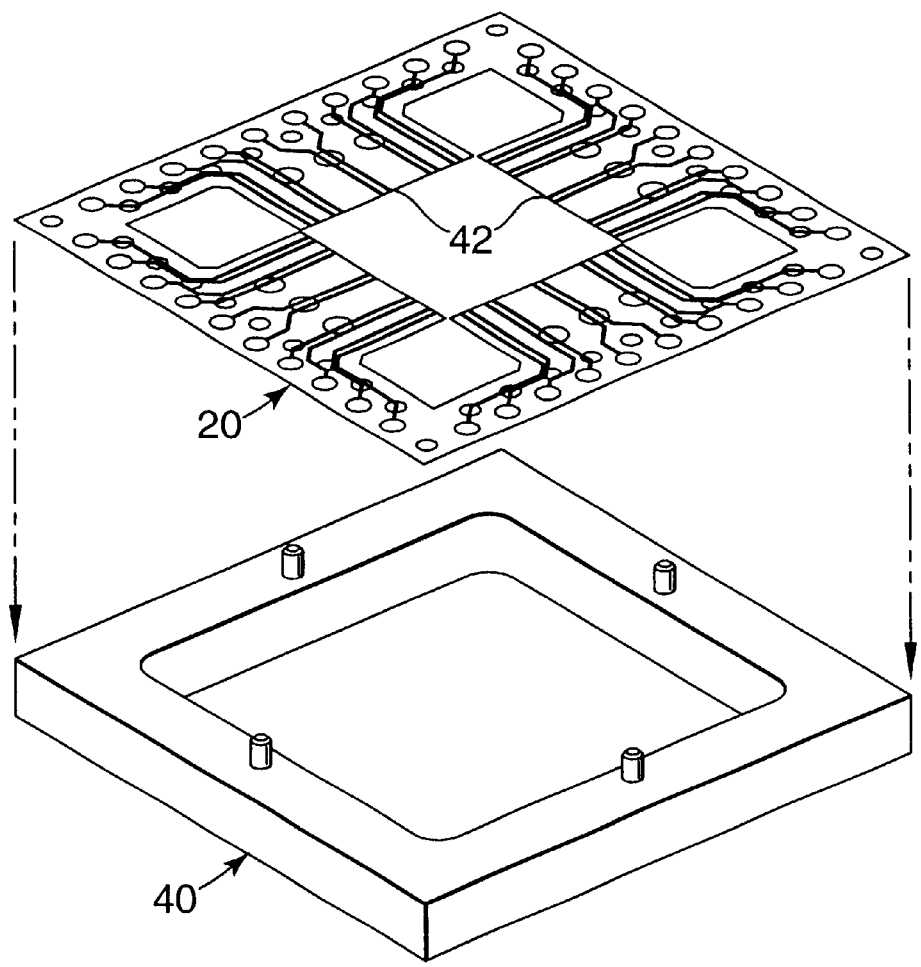
FIG. 4 is a perspective view illustrating the use of a pin plate fixture for receiving a flex circuit which is to be incorporated into the MEMS package of FIG. 1.
Figure 5:
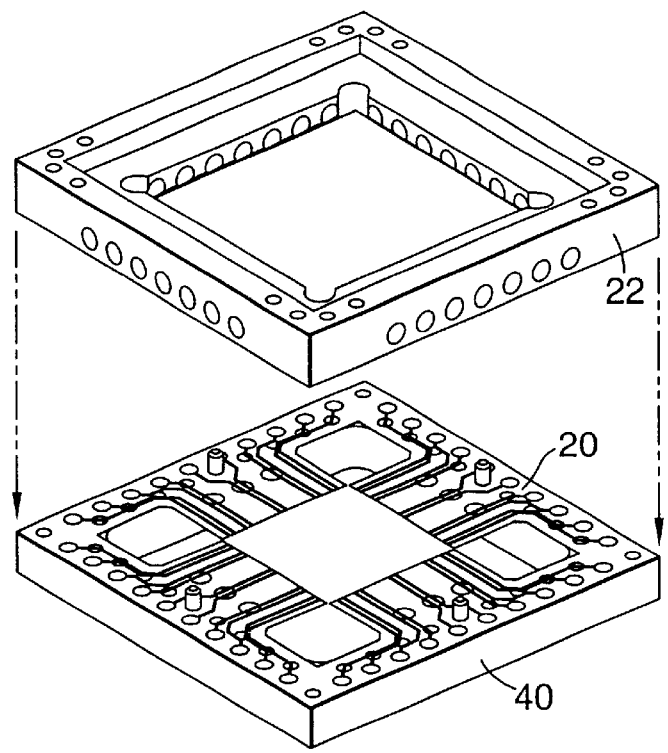
FIG. 5 is a perspective view illustrating the attachment of the flex circuit of FIG. 4 to a pad insert using the pin plate fixture.

FIG. 4 shows a 40-lead flex circuit 20 being placed onto a pin plate fixture 40. Pin plate fixture 40 is used only in the early assembly of package 10 and is removed prior to package completion. Flex circuit 20 has inner leads 42 which are configured to align with the bond pads 36 of MEMS die 12. Flex circuit 20 is comprised of a flexible dielectric substrate on which there are thin and separate conductors provided to route signals and electrical power from the inner lead area to the outer lead area of an electronic package. As further seen in FIG. 5, pad insert 22 is placed onto the pins 44 of pin-plate fixture 40 and on top of flex circuit 20. Pad insert 22 and flex circuit 20 are mechanically aligned by the guiding action of pins 44 in pin plate fixture 40.

Figure 6:
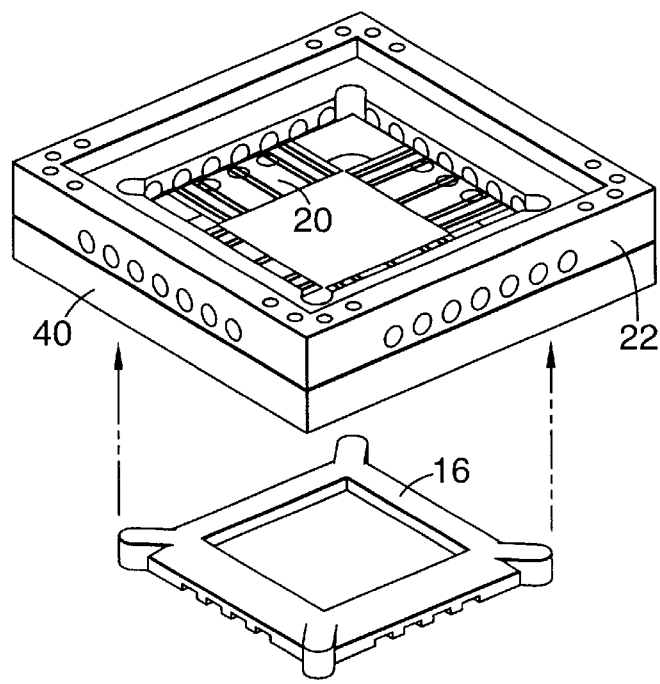
FIG. 6 is a perspective view illustrating the attachment of a carrier insert to the flex circuit subassembly of FIG. 5, resulting in deflection of the inner lead portions of the flex circuit.

Carrier insert 16, which is assembled into flex circuit subassembly 46 from the bottom as shown in FIG. 6, provides final alignment of MEMS subassembly 32 into package 10. Carrier insert 16 has a sloping surface at its outer perimeter where it touches the inner-lead area of flex circuit 20. The purpose of this sloped surface on carrier insert 16 is to bend the corresponding portions of flex circuit 20 upward so that the inner leads 42 can be brought up to the plane of bond pads 36 on MEMS die 12. Carrier insert 16 also has slots along its bottom edge that allow for the final package mold material to flow inward toward and interlock the perimeter detail of MEMS carrier 14 into the final package. Carrier insert 16 self-aligns into pad insert 22 and mechanically snaps into place.

Figure 7:
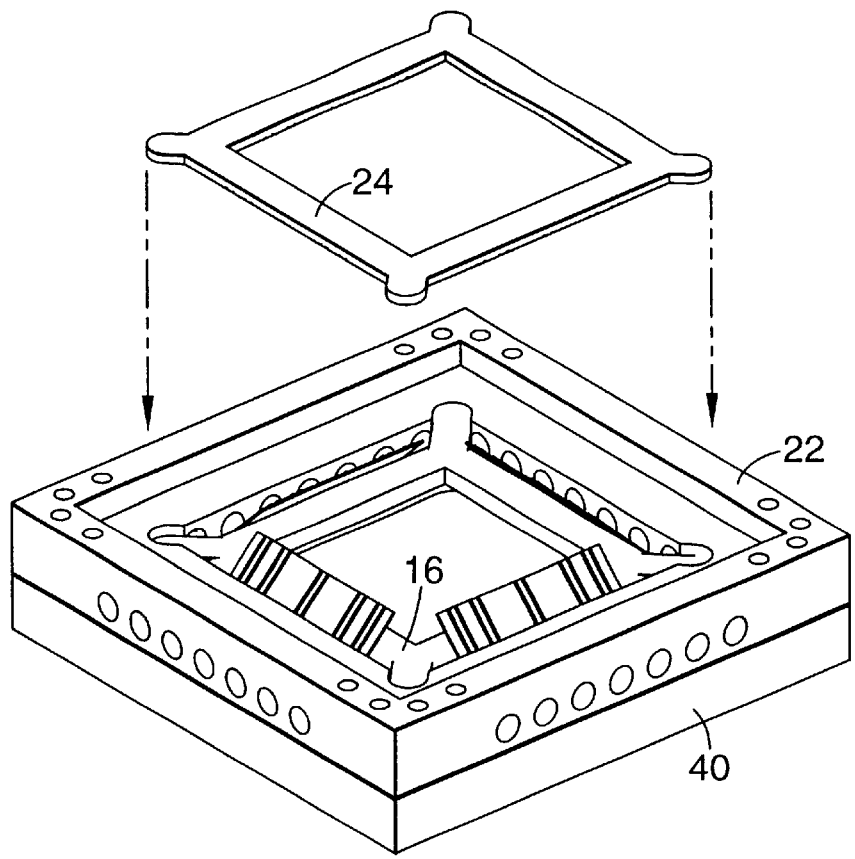
FIG. 7 is a perspective view illustrating the attachment of a cover insert to the flex circuit subassembly of FIG. 6, resulting in the returning of the inner lead portions of the flex circuit to a horizontal orientation.

With this orientation of flex circuit 20, the inner-leads are now deflected upward a skewed angle by the introduction of the carrier insert 16. Cover insert 24 is then added to the sub-assembly as shown in FIG. 7. Cover insert 24 has details on each corner that interlock with pad insert 22 to fix its position in the package. Cover insert 24 serves the function of deflecting the inner lead portion of flex circuit 20 back into the horizontal plane, and also serves as a "molding dam" that keeps the final package mold material from flowing inward and encroaching onto the delicate MEMS mechanisms 34 on top of the MEMS die 12. Cover insert 24 may also have grooves on its lower surface that are sized to accommodate the conductor leads of the flexible circuit. Mold shut-off may also be achieved by embedding the leads into the substrate and using a plain-bottomed cover insert. By providing these grooves on cover insert 24, it may extend into the space between the inner-lead conductors and thereby keep high pressure mold flow from reaching the MEMS mechanism area (discussed below in conjunction with FIGS. 11 and 12). In an alternative embodiment wherein the final package mold cavity pressure is low enough that the material simply will not flow through these small inner-lead spaces, the carrier insert has a plain bottom (no grooves). Cover insert 24 is self-guided into pad insert 22 and mechanically snaps into place.

Figure 8:
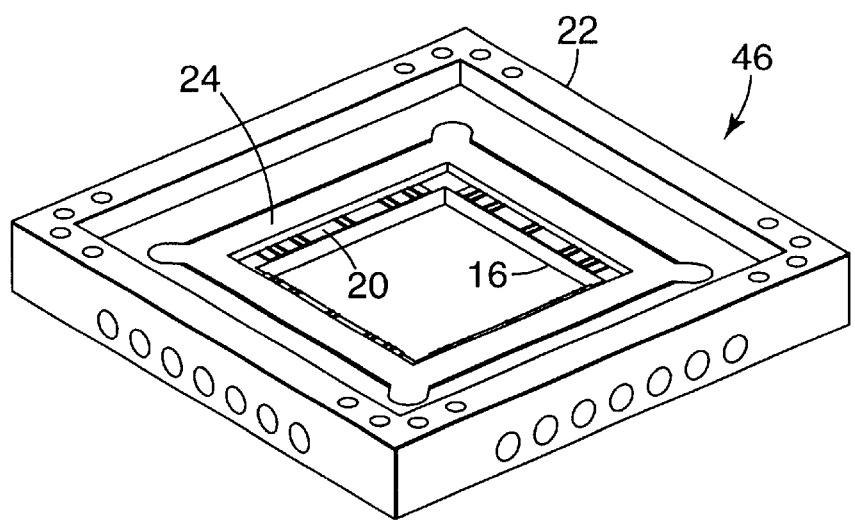
FIG. 8 is a perspective view of the completed interconnect subassembly of FIG. 7 with the pin plate fixture removed.
Figure 9:
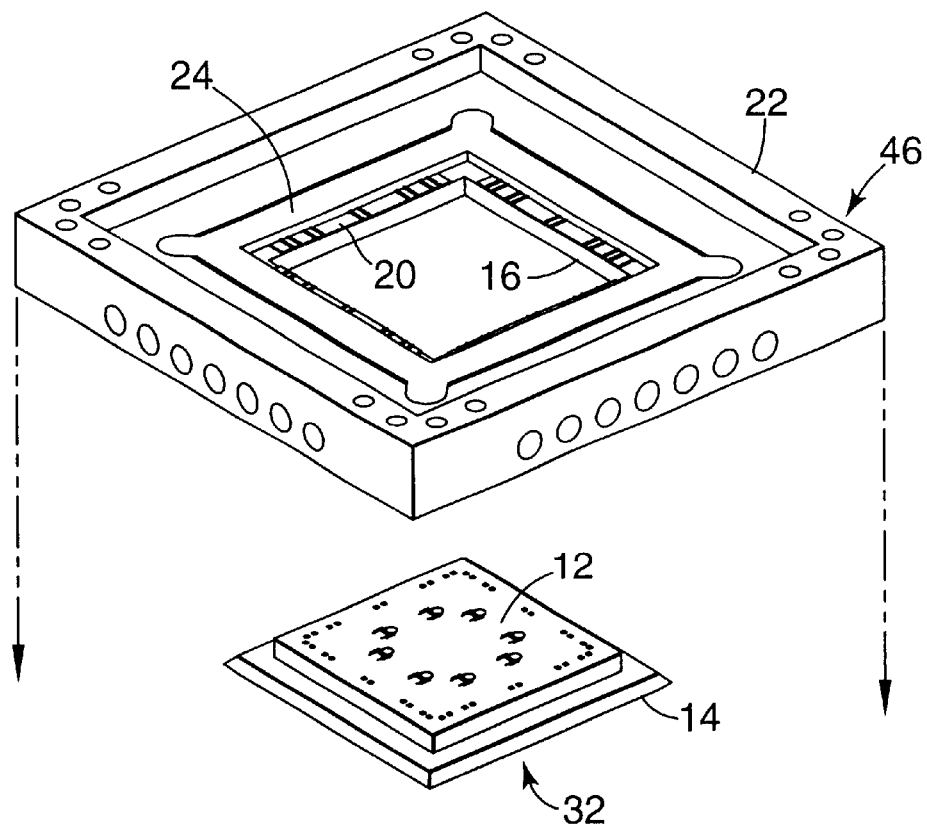
FIG. 9 is a perspective view illustrating the attachment of the interconnect subassembly of FIG. 8 to the MEMS subassembly of FIG. 3.

FIG. 8 illustrates a completed flex circuit subassembly 46 which is then combined with the MEMS subassembly 32 to result in a near-finished package 10; at this point pin plate fixture 40 has been removed. FIG. 9 shows the joining of the two completed subassemblies. Flex circuit subassembly 46 can be lowered onto a stationary MEMS subassembly 32, or the MEMS subassembly can be raised and inserted into the bottom of the interconnect sub-assembly. Carrier insert 16 provides three-dimensional alignment of the two subassemblies relative to each other. Carrier insert 16 also overlaps a portion of the upper surface of MEMS carrier 14 so that the final package mold flow is shut-off from reaching the MEMS mechanism area of the completed package.

Figure 10:
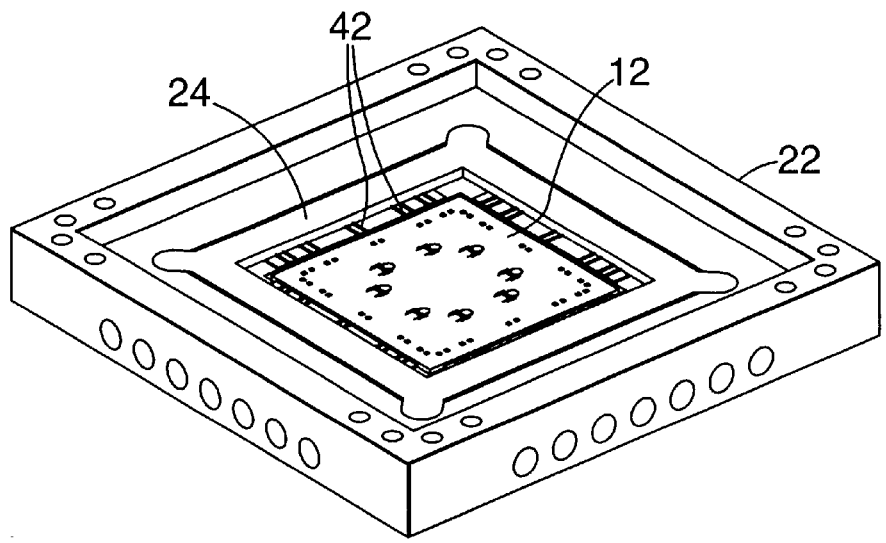
FIG. 10 is a perspective view of the MEMS and interconnect subassemblies after inner-lead bonding.

This portion of the package is now ready for the operation of connecting the inner leads of flex circuit 20 with bond pads 36 on MEMS die 12. The inner-lead connection can be made a number of ways including wire bonding or TAB inner-lead bonding. With TAB bonding technology, the inner leads of the flexible circuit are cantilevered beyond the edge of the flexible circuit substrate and placed over bumps that have been provided on the MEMS die. The inner leads can then bonded to the bumps on the die with bonding technologies such as gang thermo-compression or single-point thermosonic inner-lead bonding. FIG. 10 shows the state of the fully assembled package 10 after inner leads 42 of flex circuit 20 have been connected to bond pads 36 on MEMS die 12.

Figure 11:
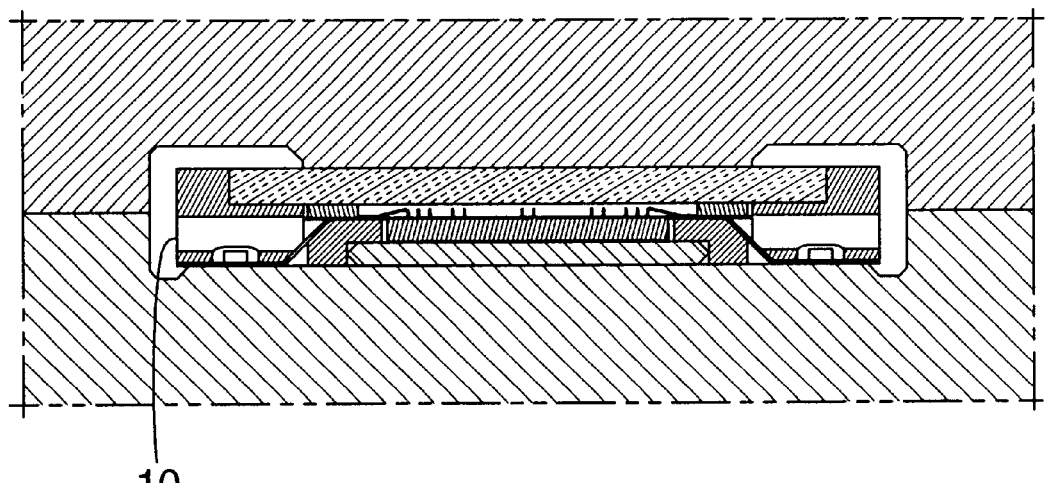
FIG. 11 is a cross-sectional view of a cavity mold for overmolding the combined MEMS and interconnect subassemblies with a package cover.

After assembly, package 10 may be subjected to a package mold process. Various techniques may be used to provide the final package mold, particularly transfer or injection molding techniques, or other molding or encapsulation processes, depending upon the characteristics of the material that will make up the final package overmolded body. FIG. 11 shows a simplified view of a mold cavity used to injection mold the final package body (mold flow porting is not shown). If a material such as liquid crystal polymer (LCP) is used, then the grooves on the bottom of cover insert 24 may be eliminated.

Figure 12:
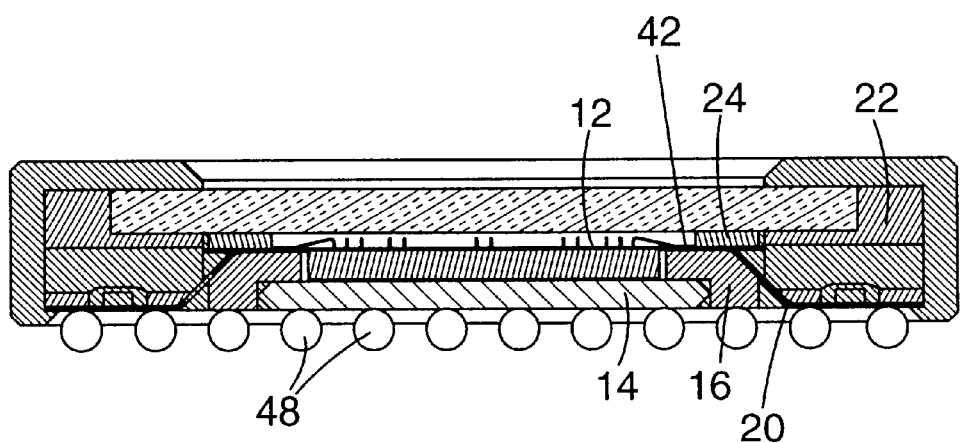
FIG. 12 is a cross-sectional view of the overmolded MEMS package resulting from the molding process shown in FIG. 11, with solder balls attached.

In FIG. 11 all of the clear space (areas not shown with section hatch lines), with the exception of the area just above the MEMS die, will fill with the final package material. FIG. 12 is a cross-section of the overmolded package. The design of the inserts in the package advantageously provide for the final package mold material to flow into strategic locations to lock the package into one integral unit. The inserts further prevent the final package material from flowing into the MEMS device area on top of the MEMS die. FIG. 12 also shows the addition of solder balls 48 to the package as a ball grid array.

The cover of the final package may have various characteristics. It may be transparent or opaque, metallic or elastomeric, or have ports for fiber-optic cables to enter into the MEMS device area, or for capillary tubes to enter into the MEMS device area.

Figure 13:
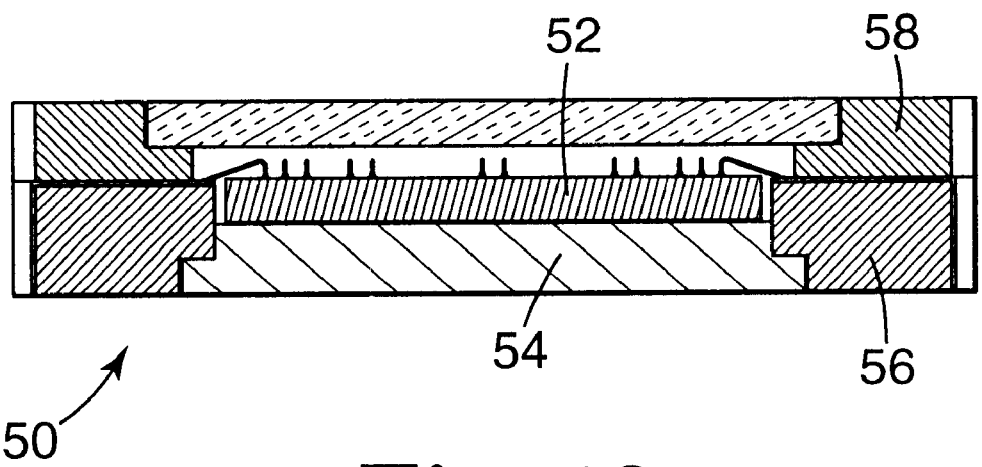
FIG. 13 is a cross-sectional view of an alternative embodiment of a MEMS package constructed in accordance with the present invention.

An alternative MEMS package 50 constructed in accordance with the present invention is shown in FIG. 13, in cross-section. As with the previous design, the design of MEMS package 50 includes a MEMS die 52 and a carrier 54 that is used during the early stage of completing the package, and is encased in the final package as well. The stepped edges on the perimeter of carrier 54 again serve to facilitate handling during the early stages of processing by providing a mechanical detail that is easy to grip, and further allow the carrier to be locked into place when the carrier is bonded to its mating package cavity, as explained further below.

Figure 14:
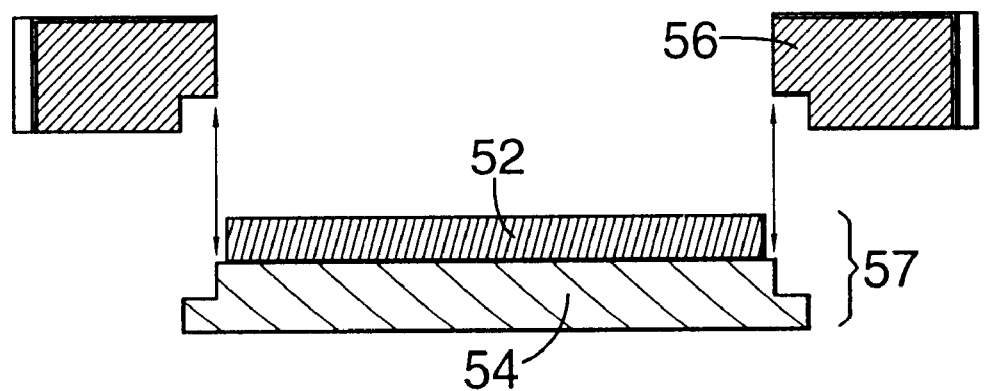
FIG. 14 is a side view illustrating the attachment of the lower package cavity of the MEMS package of FIG. 13 to the die/carrier subassembly.
Figure 15:
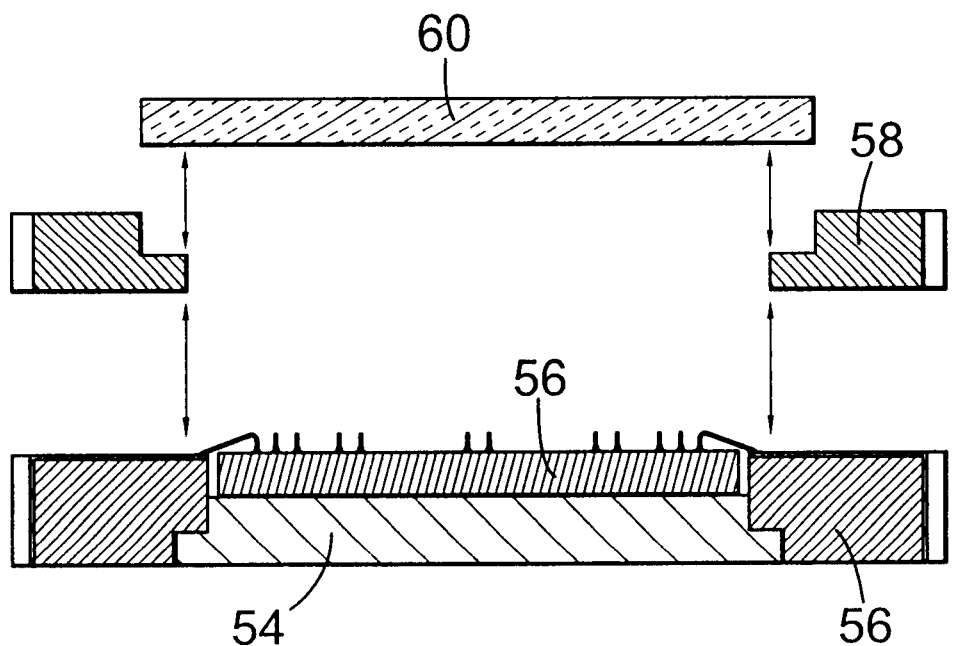
FIG. 15 is a cross-sectional view illustrating the attachment of the upper package cavity and cover of the MEMS package of FIG. 13 to the lower half of the package.

MEMS die 52 is released as before, and carrier 54 facilitates handling of the MEMS die during the release process. After the release step, package assembly continues as illustrated in FIG. 14. The MEMS subassembly 57 (MEMS die 52 and carrier 54) is placed into a lower package cavity 56. Then the top half of the package is first completed as shown in FIG. 15. Three operations are performed at this stage. The package assembler has several options regarding the order in which the following operations are performed. The wire bonds may be made before the upper package components are placed, or alternatively these bonds could be made just prior to sealing the cover onto the package assembly. An upper package cavity 58 and a cover 60 may be placed and sealed at the same time, or alternatively upper package cavity 58 could be placed and sealed prior to cover 60 being processed. A "getter" may be trapped in the cavity area directly above the MEMS devices. At the time of the final sealing of package 50, the package may have been evacuated (e.g. in a vacuum bake oven) and filled with a suitable inert gas.

Figure 16:
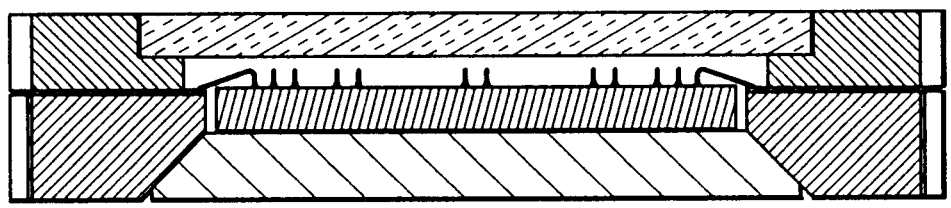
FIG. 16 is a cross-sectional view illustrating alternative design details for the MEMS package of FIG. 13.

Variations in the design of package 50 include different MEMS carrier profiles which still facilitate the handling of the MEMS die during release processing, such as a beveled MEMS carrier. A one-piece cover may also be used to complete the top half of the package, in lieu of upper package cavity 58. These constructions are shown in FIG. 16.

Figure 17:
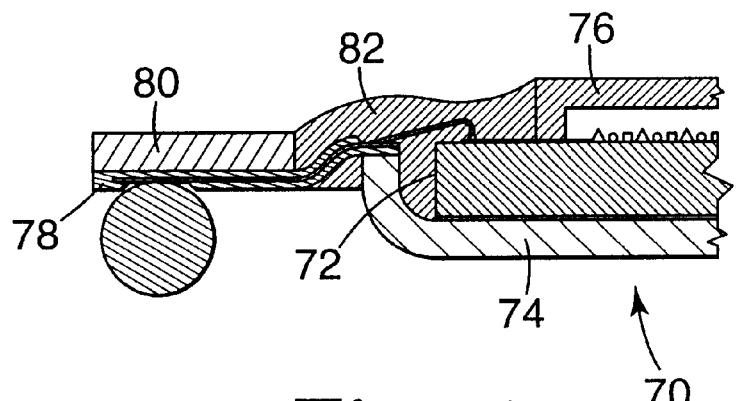
FIG. 17 is a cross-sectional view of a "cavity-up" variation of another embodiment of the present invention.

Two additional embodiments of the present invention are described with reference to FIGS. 17–26. FIG. 17 is a cross-sectional view illustrating a "cavity-up" variation for this alternative package configuration. Package 70 includes many components which are similar to those previously described, including a MEMS die 72, a carrier 74, a cover 76, a flex circuit 78, a stiffener 80, and an overmold body 82.

Figure 18:
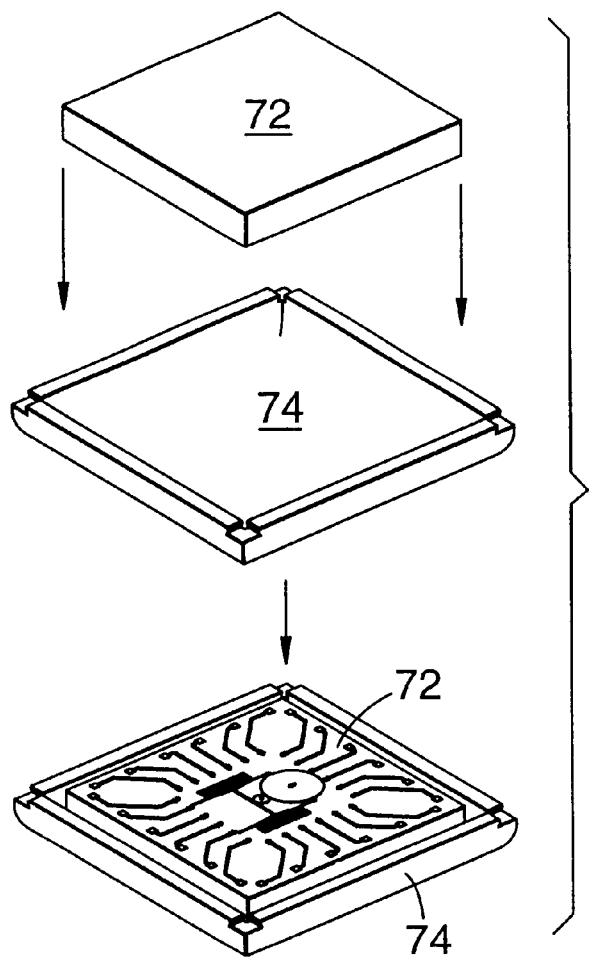
FIG. 18 is a perspective view illustrating the attachment of the MEMS die and carrier in FIG. 17 and the subsequent release of a protective cover on the die.
Figure 19:
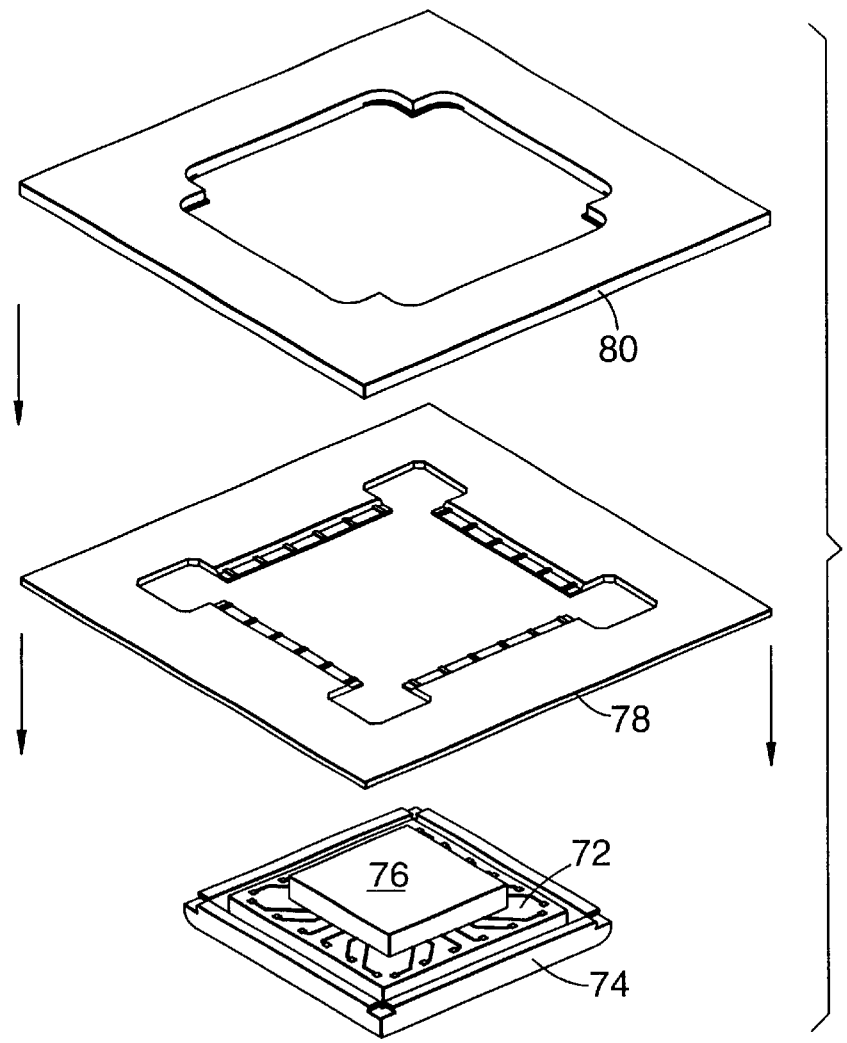
FIG. 19 is an exploded perspective view illustrating the interlocking layers of the MEMS package of FIG. 17.

FIG. 18 shows the process of attaching MEMS die 72 to carrier 74, followed by the release process. Carrier 74 again has appropriate mechanical details to enhance its function. In FIG. 19, hermetic cover 76 has been added to the face of the die. The hermetic lid can be bonded to the face of the MEMS die with a number of techniques including glass-frit, eutectic gold, or anodic bonding. A bonding perimeter is advantageously provided between the MEMS mechanisms and their interconnection pads.

FIG. 19 shows the next step in the assembly of package 70, that of attaching the substrate of flex circuit 78 to stiffener 80. The substrate of flex circuit 78 can be thermally laminated, or an adhesive can be used. Stiffener 80 and flex circuit 78 are attached to MEMS carrier 74 using the interlocking features provided on the stiffener and the MEMS carrier.

Figure 20:
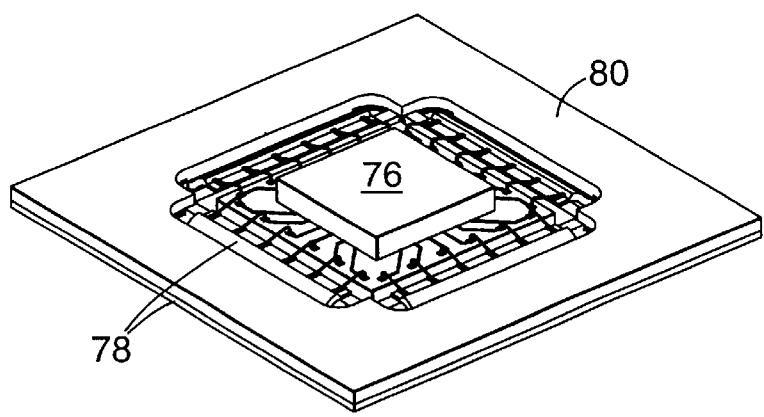
FIG. 20 is a perspective view of the die/carrier subassembly of FIG. 18 combined with the flex circuit subassembly of FIG. 19 after inner-lead bonding.
Figure 21:
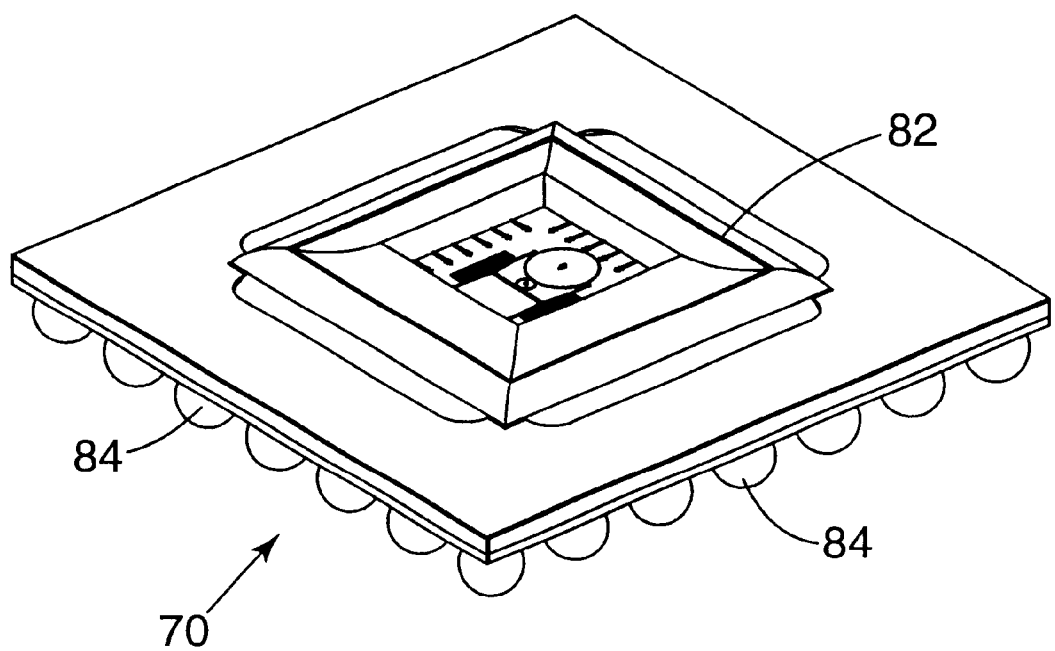
FIG. 21 is a perspective view of the completed package of FIG. 20 after overmolding and affixing solder balls.

Once the flexible circuit and MEMS subassemblies are assembled into one unit, then the inner lead bonds can be made, as shown in FIG. 20. This package 70 example shows the use of wire bonds to connect the I/O pads on the MEMS die to the flexible circuit leads. An alternative approach would be to have the flexible circuit lead cantilevered over and bonded to bumps that have been added to the bond pads on the MEMS die. FIG. 21 shows the completed package after overmold body 82 and solder balls 84 have been applied.

Figure 22:
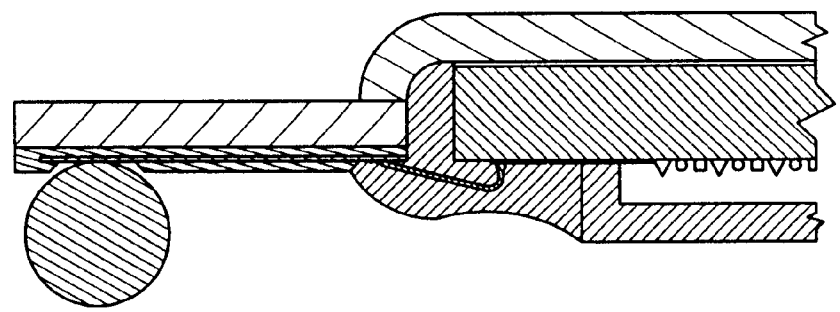
FIG. 22 is a cross-sectional view of a "cavity-down" variation of another embodiment of the present invention.
Figure 23:
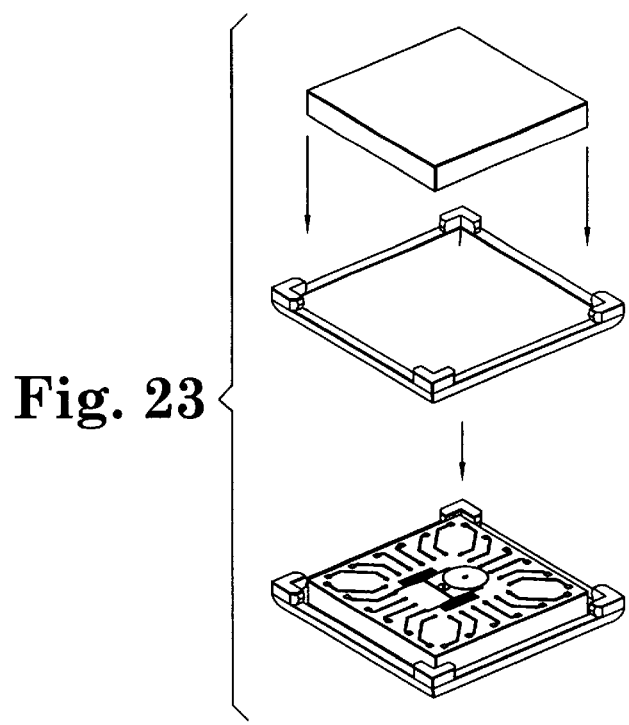
FIG. 23 is a perspective view illustrating the attachment of the MEMS die and carrier in FIG. 22 and the subsequent release of a protective cover on the die.

A "cavity-down" variation of the foregoing configuration is illustrated in FIGS. 22–26. In this configuration the MEMS carrier is on top of the package in the final assembly, as shown in FIG. 22. FIG. 23 illustrates the process of attaching the MEMS die to its carrier, followed by the release process. An alternative interlocking detail is shown for the carrier.

Figure 24:
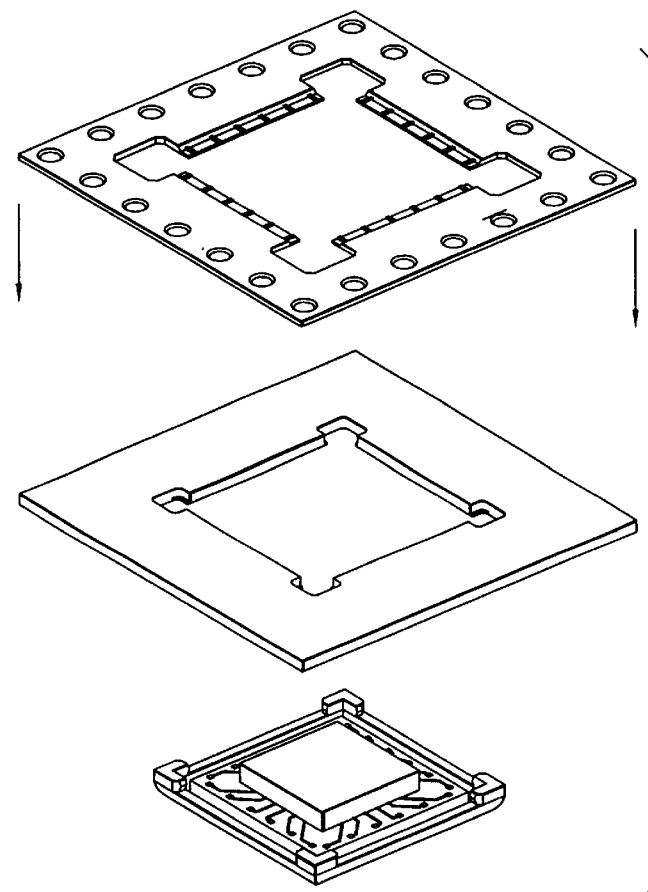
FIG. 24 is an exploded perspective view illustrating the interlocking layers of the MEMS package of FIG. 22.
Figure 25:
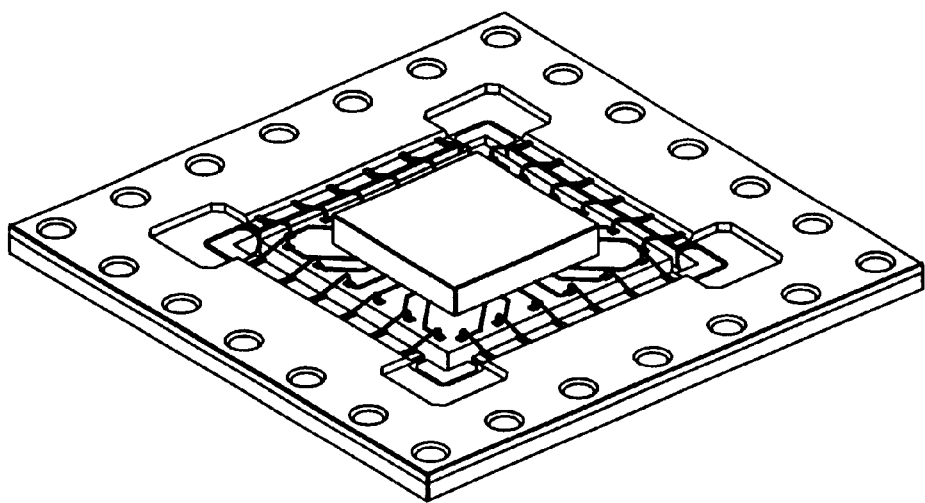
FIG. 25 is a perspective view of the die/carrier subassembly of FIG. 23 combined with the flex circuit subassembly of FIG. 24 after inner-lead bonding.
Figure 26:
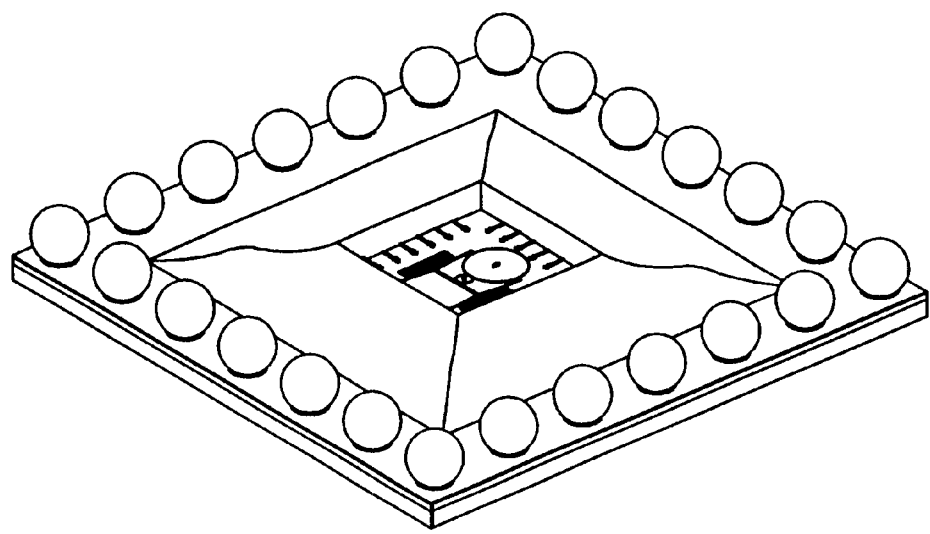
FIG. 26 is a perspective view of the completed package of FIG. 25 after overmolding and affixing solder balls.

FIG. 24 depicts the attachment of the substrate of the flexible circuit to the stiffener, similar to FIG. 19; however, in FIG. 24 the stiffener with the interlocking detail is placed between the MEMS subassembly and the flex circuit, while in FIG. 19 the flex circuit is placed between the MEMS subassembly and the stiffener with the interlocking detail. The stiffener and flex circuit are attached to the MEMS carrier using the interlocking features provided on the stiffener and the MEMS carrier. The inner lead bonds are again made, shown in FIG. 25, as wire bonds. FIG. 26 shows the completed package after the overmold body and solder balls have been applied.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. An interconnect subassembly comprising:
    a first package insert;
    a flex circuit placed on said first package insert, wherein said flex circuit has lead portions to interconnect with bond pads formed on an electronics device die;
    a second package insert attached to said first package insert which deflects said lead portions of said flex circuit from a first plane toward a second plane; and
    a third package insert applied to said first package insert which re-deflects said lead portions of said flex circuit toward the first plane.

2. An electronic device package utilizing the flex circuit interconnect subassembly of claim 1, and further comprising an electronic device die/carrier subassembly attached to the flex circuit interconnect subassembly.

3. The electronic device package of claim 2 wherein said electronic device die/carrier subassembly includes a carrier permanently affixed to a micro-electromechanical system (MEMS) die.

4. The electronic device package of claim 3 wherein said MEMS die has a first surface supporting one or more MEMS components, and a second surface which is attached to said carrier, said first surface further having had removed a protective coating overlying said one or more MEMS components.

5. The flex circuit interconnect subassembly of claim 1 wherein:
    said first package insert is a generally rectangular pad insert having an interior void;
    said flex circuit is generally rectangular and sized to fit an outer perimeter of said pad insert, with said lead portions of said flex circuit extending inwardly toward said interior void of said pad insert; and
    said second package insert is a generally rectangular carrier insert, smaller than said pad insert, having at least one sloping surface abutting said lead portions of said flex circuit.

6. The flex circuit interconnect subassembly of claim 5 wherein said third package insert is a generally rectangular cover insert, smaller than said pad insert, at least one surface abutting said lead portions of said flex circuit.

7. The flex circuit interconnect subassembly of claim 6 wherein:
    said carrier insert has surface features along a bottom surface adapted to allow mold material to flow inwardly; and
    said cover insert serves as a molding dam to prevent said mold material from flowing inwardly.

8. An electronic device package utilizing the flex circuit interconnect subassembly of claim 1, and further comprising:
    an electronic device die/carrier subassembly attached to the flex circuit interconnect subassembly, wherein the electronic device die/carrier subassembly includes a carrier permanently affixed to an electronic device die having a first surface supporting one or more electronic components, and a second surface which is attached to said carrier; and
    a cover attached to the flex circuit interconnect subassembly, overlying said first surface of said electronic device die.

9. The electronic device package of claim 8 further comprising an overmold body encasing a portion of said electronic device package.

* * * * *